United States Patent [19]

Hisano et al.

[11] 4,110,821
[45] Aug. 29, 1978

[54] SEMICONDUCTOR DEVICE HAVING A SEMICONDUCTOR ACCOMMODATED IN A SEALED VESSEL

[75] Inventors: Hiroshi Hisano, Fuchu; Kyoichi Sato, Yokohama, both of Japan

[73] Assignee: Tokyo Shibaura Electric Co., Ltd., Japan

[21] Appl. No.: 760,739

[22] Filed: Jan. 19, 1977

[30] Foreign Application Priority Data

Jan. 20, 1976 [JP] Japan .................................... 51-5300

[51] Int. Cl.² ........................................... H02M 7/00
[52] U.S. Cl. ..................................... 363/141; 62/216; 165/105; 357/82; 363/126
[58] Field of Search ........... 165/105; 174/14 R, 15 R; 361/382, 385; 357/82; 363/141, 146

[56] References Cited

U.S. PATENT DOCUMENTS

| | | | |
|---|---|---|---|
| 1,013,767 | 1/1912 | Hadley | 174/14 R |
| 3,272,258 | 9/1966 | Bourquard | 165/105 T X |
| 3,358,104 | 12/1967 | Cromer et al. | 174/14 R X |
| 3,483,306 | 12/1969 | Harper | 174/14 R |
| 3,581,811 | 6/1971 | Julie | 165/105 X |

Primary Examiner—William M. Shoop
Attorney, Agent, or Firm—Oblon, Fisher, Spivak, McClelland & Maier

[57] ABSTRACT

A semiconductor device includes a sealed vessel accommodating a semiconductor body and a heating element. When the semiconductor body is not energized, the heating unit is heated.

7 Claims, 8 Drawing Figures

SEMICONDUCTOR DEVICE HAVING A SEMICONDUCTOR ACCOMMODATED IN A SEALED VESSEL

BACKGROUND OF THE INVENTION

This invention relates to a semiconductor device, and more particularly to a evaporation-boiling cooling type semiconductor device providing freon (TM) as a cooling medium.

There is a semiconductor device which accommodates a semiconductor body and freon as a cooling medium and the generated heat of the semiconductor body is cooled by vaporization under evaporation-boiling of the freon.

In usual operation of a such semiconductor device, pressure in the vessel caused by a vaporization of the freon while absorbing heat of the semiconductor body is maintained at positive pressure sufficiently higher than a pressure outside of the vessel i.e., atmosphere.

Accordingly, in this condition, even through leakage exists in the sealed vessel, the atmosphere does not invade the sealed vessel.

However, when the semiconductor does not operate for some cause, the heating of the semiconductor body does not exist, and since the vaporization of freon does not occur, pressure in the vessel will become negative and it is smaller than the atmosphere.

Therefore, the atmosphere invades the vessel if the leakage exists in the sealed vessel when the commercial power fails.

SUMMARY OF THE INVENTION

Accordingly, one object of this invention is to provide an improved semiconductor device which can be operated in stable state.

Another object of this invention is to provide an improved semiconductor device wherein pressure in the vessel is always maintained at pressure higher than the atmosphere.

Further object of this invention is to provide an improved semiconductor device, wherein the atmosphere does not invade the vessel through the leakage in the event of commercial power failure.

According to this invention, there is provided a semiconductor device for converting electric power flowing between a power supply and a load, comprising a sealed vessel filled, with a cooling medium, a rectifier unit accommodated in the sealed vessel and adapted to be energized by the power supply to apply rectified power to the load, means for detecting deenergization of the rectifier unit, and means for applying the power from a separately independent power supply to the rectifier unit in response to the output of the means for detecting.

BRIEF DESCRIPTION OF THE DRAWINGS

The exact nature of this invention, as well as other objects and advantages thereof, will be readily apparent from consideration of the following description relating to an annexed drawings in which.

DESCRIPTION OF THE PREFERRED EMBODIMENTS

Figure 1:
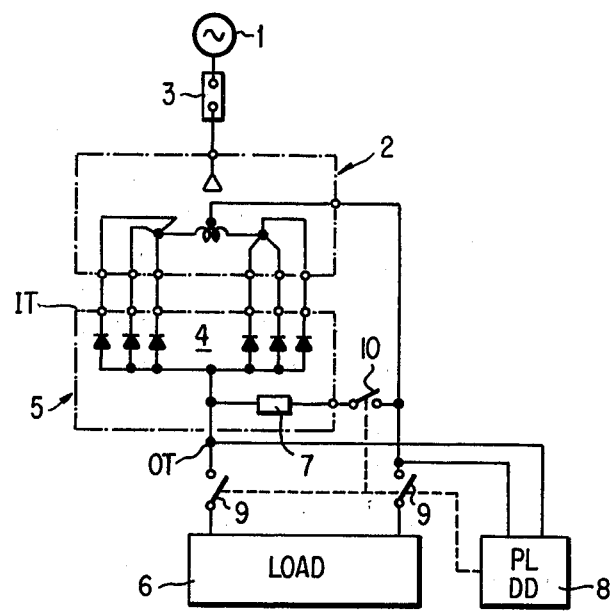
FIG. 1 is a block diagram of a semiconductor device according to this invention.
Figure 2:
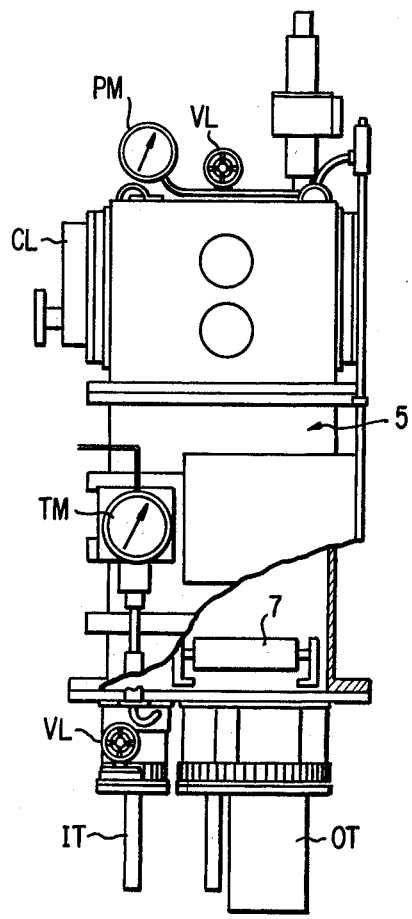
FIG. 2 illustrates a front view, partly in section, of a semiconductor device of a preferred embodiment of this invention.

Referring now to the drawing, wherein like reference characters designate identical or corresponding parts throughout the several views, and more particularly to FIG. 1, a transformer 2 is energized by AC power of an AC source 1 through the circuit breaker 3. The transformer 2 comprises a primary winding connected in Δ-connection and a pair of secondary windings connected in Y-connection, and an interphase reactor having an intermediate tap connected between neutral points of the secondary windings.

A rectifier unit 4 connected with the secondary windings of the transformer 2 is accommodated in a sealed vessel 5 filled with freon so as to cool the heat of rectifier unit 4 by evaporation under evaporation-boiling of freon.

In this case, the sealed vessel 5, as shown in FIG. 1, is provided with an input terminal IT to be connected the secondary windings, an output terminal OT, a pressure gauge PM for indicating an internal pressure of the sealed vessel 5, a thermometer TM for indicating an internal temperature of the sealed vessel 5, various valves and a cooler for cooling an upper part of the sealed vessel 5.

A load 6, which is supplied with a D.C. electric power rectified via the rectifier unit 4, is connected between the output terminal OT of the rectifier unit 4 and the intermediate point of the reactor in the transformer through the switch 9.

A heating unit 7, which is accommodated with the rectifier unit 4 in the sealed vessel 5, in connected between the output terminal OT of the rectifier unit 4 and the intermediate point of the reactor through the switch 10.

A power loss detecting device 8, which is connected between the D.C. output terminals to detect loss of the power to be supplied to the load 6, acts to open the switch 9 to disconnect the load 6 from the D.C. power source, and to close the switch 10 to connect the rectified heating unit 7 with the D.C. power source and to obtain the heating by the energizing of the heating unit 7 in the sealed vessel 5 when the loss of power happens.

An operation of above mentioned embodiment shown in FIG. 1 is described.

During normal operation of the rectifier unit 4, D.C. power is supplied from the rectifier unit 4 to the load 6, and the pressure in the sealed vessel 5 is maintained higher than atmospheric pressure as a result of the evaporation of the Freon, which absorbs heat produced by the rectifier unit 4.

Accordingly, in this condition the atmosphere does not invade the vessel 5 if the leakage exists in the sealed vessel 5 because pressure in the vessel 5 is higher than the atmosphere.

When supplying of D.C. power to the load 6 is interrupted by some cause, the interruption source is detected by the power loss detecting device 8.

The switch 9 is thereby opened to disconnect the load 6 from the output terminal OT, and at the same time the switch 10 is closed to connect the heating unit 7 to the output terminal OT.

After operation of the switches 9, 10 the load 6 is disconnected from the rectifier unit 4, and the heating unit 7 is connected across the output terminals OT. The heating unit 7 is thereby heated by D.C. power supplied thereto from the rectified unit 4, causing Freon to evaporate, and maintaining pressure within the sealed vessel higher than atmospheric pressure. Accordingly, atmospheric gases are prevented from entering the sealed vessel 5.

Figure 3:
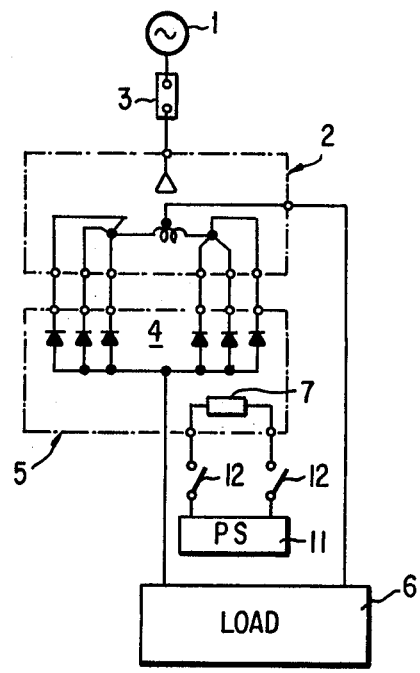
FIGS. 3 to 8 are block diagrams of the other preferred embodiments of this invention.

In addition, this invention is not only limited to the embodiment described above and there is obtained a similar effect as described above if, for example, the heating unit 7 is connected to a separately independent A.C. or D.C. power supply 11 through a switch 12 so as to cause the switch 12 to close and thereby to cause the heating unit 7 to heat when the power loss happens under failure of the load 6 or the A.C. power supply 1, as shown in FIG. 3.

This embodiment of the invention shown in FIG. 3 is useful when the A.C. power fails.

Figure 4:
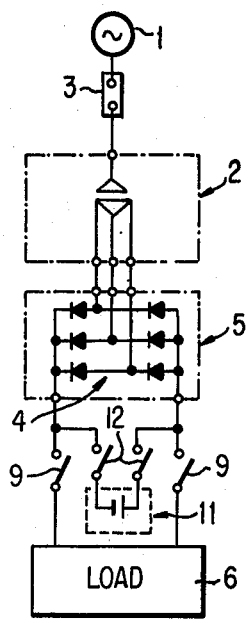

Furthermore, in case as shown in FIG. 4 that the rectifier unit 4 is constituted by the Graetz-connection, a D.C. power supply 11 is connected between the output terminals of the rectifier unit 4 through the switch 12 without specially providing the heating unit 7.

When the power loss detecting device (not shown) is operated, i.e., when the A.C. power source failure happens, the switch 12 is closed and at the same time the switch 9 for switching the passage to the load is opened in order to heat the rectifier unit 4 by passing the suitable current from the D.C. power supply 11.

According to the embodiment of this invention shown in FIG. 4, the semiconductor device can be made of small size and is easily maintained.

Figure 5:
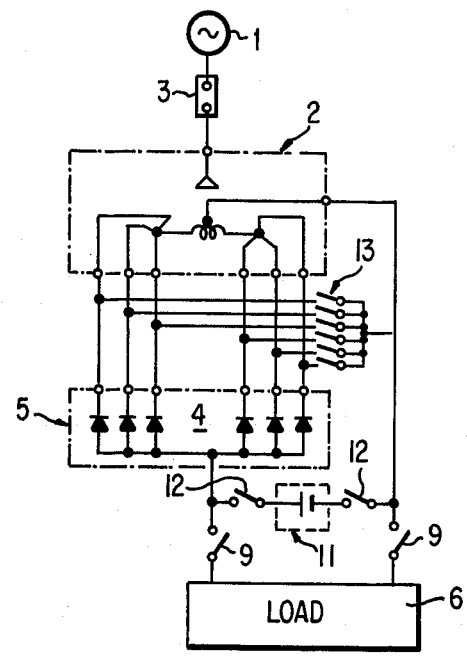

Furthermore, as shown in FIG. 5, it may be constituted so that a separately independent D.C. power supply 11 is connected between the output terminal of the rectifier unit 4 and the intermediate tap of the interphase reactor in the transformer 2 and that a plurality of the interlocking switches 13 as shown are connected between input terminals of the rectifier unit 4 and the intermediate tap of the interphase reactor.

When the power loss happens under failure of the load 6 or the A.C. power supply 1, by the power loss detecting device, not shown, the switch 9 is opened to disconnect the load 6 from the rectifier unit 4 and at the same time the switch 12 and the interlocking switches 13 are closed to supply D.C. power from the D.C. power supply 11 to the rectifier unit 4 as shown in FIG. 4.

Similar effects as described above in FIG. 1 are obtained by the heating of the rectifier unit 4 in the sealed vessel 5.

Figure 6:
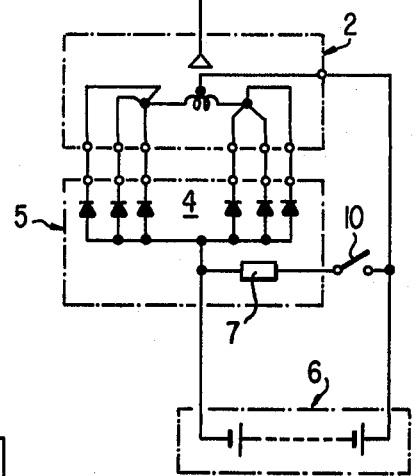

In the other hand, in case that the load 6 is an electrolytic cell, and an electrolyzer, or a secondary battery, the heating unit 7, such as resistor which is connected in series to a switch 10 in the sealed vessel is connected in parallel with the load 6 as shown in FIG. 6.

When the energization to the rectifier unit 4 stops, the switch 10 is closed by the power loss detecting device, not shown, to cause the heating unit 7 to heat by means of the load i.e. the secondary battery.

Figure 7:
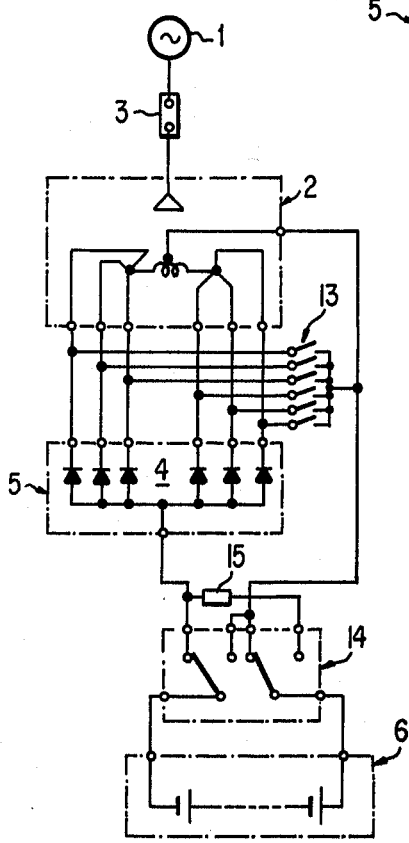

Furthermore, similar effects as described above are obtained by the embodiment as shown in FIG. 7. As a combination of embodiments shown in FIGS. 5 and 6, in case that the load 6 is a secondary battery, a pole changer 14 is provided between the D.C. power source rectified by the rectifier unit 4 and the secondary battery 6.

When the energization to the rectifier unit 4 stoppes stops, by the power loss detecting device, not shown, the switch 14 is changed over so as to cause the D.C. power source from the secondary battery 6 to supply the rectifier unit 4 through a resistor 15 for limiting the current of the rectifier element. At the same time the interlocking switches 13 is closed.

Figure 8:
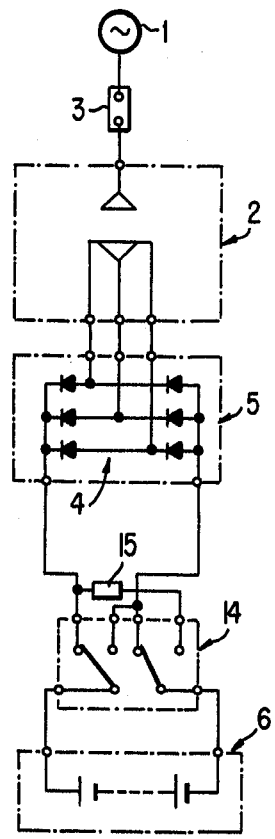

FIG. 8, furthermore, shows another embodiment wherein the rectifier unit is constituted with the Graetz-connection as a modification of the embodiment shown in FIG. 7.

According to this invention, as it is possible to always maintain the pressure in the vessel at pressure which is higher than the atmosphere, it is possible to prevent the deterioration of the cooling medium, such as freon.

Furthermore, it is possible to continuously operate the semiconductor device for long time periods.

Obviously, numerous modifications and variations of this invention are possible in light of the above teachings. It is therefore to be understood that within the scope of the appended claims the invention may be practiced otherwise than as specifically described herein.

What is claimed as new and desired to be secured by letters patent of the United States is:

1. A semiconductor device for converting electric power flowing between an A.C. power supply and a load comprising:
   a sealed vessel filled with a cooling medium;
   a rectifier unit accommodated in the sealed vessel and adapted to be energized by the A.C. power supply for applying rectified power to the load;
   means for detecting deenergization of the rectifier unit and providing an output signifying the same;
   a heating unit accommodated in the sealed vessel; and
   means responsive to the output of the detecting means for applying rectified power from the rectifier unit to the heating unit.

2. A semiconductor device for converting electric power flowing between an A.C. power supply and a load comprising:
   a sealed vessel filled with a cooling medium;
   a rectifier unit accommodated in the sealed vessel and adapted to be energized by the A.C. power supply for applying rectified power to the load;
   means for detecting deenergization of the rectifier unit and providing an output signifying the same;
   a heating unit accommodated in the sealed vessel; and
   means responsive to the output of the detecting means for applying power from a separately independent power supply to the heating unit.

3. A semiconductor device for converting electric power flowing between an A.C. power supply and a load comprising:
   a sealed vessel filled with a cooling medium;
   a rectifier unit accommodated in the sealed vessel and adapted to be energized by the A.C. power supply for applying rectified power to the load; the rectifier unit constituted by the Greatz connection;
   means for detecting deenergization of the rectifier unit and providing an output signifying the same; and
   means responsive to the output of the detecting means for disconnecting the rectifier unit from the A.C. power supply and the load and applying power from a separately independent power source to the output terminals of the rectifier unit.

4. A semiconductor device for converting electric power flowing between an A.C. power supply and a load comprising:
   a sealed vessel filled with a cooling medium;

a rectifier unit accommodated in the sealed vessel and adapted to be energized by the A.C. power supply for applying rectified power to the load;

means for detecting deenergization of the rectifier unit and providing an output signifying the same;

means responsive to the output of the detecting means for applying power from a separately independent power source to the rectifier unit.

5. The semiconductor device recited in claim 4, wherein the cooling medium is freon.

6. A semiconductor device for converting electric power flowing between an A.C. power supply and a secondary battery acting as a load comprising:

a sealed vessel filled with a cooling medium;

a rectifier unit accommodated in the sealed vessel and adapted to be energized by the A.C. power supply for applying rectified power to the load;

a heating unit accommodated in the sealed vessel; and means responsive to the output of the detecting means for applying power from the secondary battery to the heating unit.

7. A semiconductor device for converting electric power flowing between an A.C. power supply and a secondary battery acting as a load comprising:

a sealed vessel filled with a cooling medium;

a rectifier unit accommodated in the sealed vessel and adapted to be energized by the A.C. power supply for applying rectified power to the load; and means responsive to the output of the detecting means for applying power from the secondary battery to the rectifier unit.

* * * * *